(12) United States Patent
Munt et al.

(10) Patent No.: US 7,511,526 B2
(45) Date of Patent: Mar. 31, 2009

(54) CIRCUIT MODULE TESTING APPARATUS AND METHOD

(76) Inventors: Kenneth A. Munt, 2161 E. Lochmeadow Ct., Meridian, ID (US) 83642; Kenneth F. Robinson, 4496 S. Carie Way, Bosie, ID (US) 83709; Douglas C. Chambers, 4375 N. Montelino Ave., Meridian, ID (US) 83642

( * ) Notice: Subject to any disclaimer, the term of this patent is extended or adjusted under 35 U.S.C. 154(b) by 0 days.

(21) Appl. No.: 11/508,419

(22) Filed: Aug. 23, 2006

(65) Prior Publication Data

US 2008/0048684 A1    Feb. 28, 2008

(51) Int. Cl.
G01R 31/02    (2006.01)
G01R 31/26    (2006.01)

(52) U.S. Cl. .............. 324/765; 324/754; 324/158.1
(58) Field of Classification Search .......... 324/158.1, 324/754–758, 763–765
See application file for complete search history.

(56) References Cited

U.S. PATENT DOCUMENTS

| | | | |
|---|---|---|---|
| 5,061,196 A * | 10/1991 | Weston et al. ............. 439/189 |
| 5,073,117 A * | 12/1991 | Malhi et al. ............... 439/71 |
| 6,000,051 A | 12/1999 | Nadeau-Dostie | |
| 6,442,718 B1 | 8/2002 | Tran | |
| 6,586,921 B1 | 7/2003 | Sunter | |
| 6,590,404 B2 * | 7/2003 | Gardell et al. ............. 324/755 |
| 6,625,073 B1 | 9/2003 | Beffa | |
| 6,696,848 B2 * | 2/2004 | Robinson ................... 324/755 |
| 6,701,474 B2 | 3/2004 | Cooke | |
| 6,714,021 B2 | 3/2004 | Williams | |
| 6,721,195 B2 * | 4/2004 | Brunelle et al. ............ 365/63 |
| 6,819,127 B1 * | 11/2004 | Hembree ................... 324/755 |
| 6,819,129 B2 * | 11/2004 | Kim et al. .................. 324/755 |
| 6,910,162 B2 * | 6/2005 | Co et al. ................... 714/718 |
| 6,960,917 B2 | 11/2005 | Parker | |
| 7,307,427 B2 | 12/2007 | Jacobsen | |
| 7,356,737 B2 | 4/2008 | Cowell | |
| 7,388,391 B2 | 6/2008 | Renfrow | |
| 2004/0212384 A1 | 10/2004 | Maag | |
| 2005/0035754 A1 * | 2/2005 | Ho et al. ................... 324/158.1 |
| 2007/0164771 A1 | 7/2007 | Lin | |
| 2007/0198884 A1 | 8/2007 | Ni | |
| 2007/0234141 A1 | 10/2007 | Ausserlechner | |

* cited by examiner

*Primary Examiner*—Ha Tran T Nguyen
*Assistant Examiner*—Joshua Benitez

(57) ABSTRACT

A circuit module testing apparatus and method are provided. According to various embodiments, a circuit module testing apparatus includes a printed circuit board, a socket receptacle adapted to be connected to the printed circuit board, a socket having pins on a first side, the pins adapted to be removably inserted into the socket receptacle, the socket adapted to receive a circuit module for testing, and a test circuit board soldered to the first side of the socket, the test circuit board having selected pins shorted for testing the module and clipped to prevent engagement with the socket receptacle. According to one embodiment, the test circuit board has selected pins shorted for interconnect built-in self-testing (IBIST). Other aspects and embodiments are provided herein.

20 Claims, 7 Drawing Sheets

CIRCUIT MODULE TESTING APPARATUS AND METHOD

TECHNICAL FIELD

This disclosure relates to electrical circuits, and more particularly, to a circuit module testing apparatus and method.

BACKGROUND

Many digital circuits or modules require some type of testing to ensure predictable and repeatable performance. Fully-buffered dual inline memory modules (FBDIMMs), such as second generation double data rate synchronous dynamic random access memory (DDR2 SDRAM) for instance, are tested using a standard interconnect built-in self-test (IBIST). Typical testing includes soldering a motherboard socket to a load board and electrically shorting the pins on the motherboard socket. However, this does not allow for high volume testing and reduces the longevity of the load board, increasing production costs. Improved apparatus and methods for testing memory modules are needed.

DETAILED DESCRIPTION

The following detailed description refers to the accompanying drawings which show, by way of illustration, specific aspects and embodiments in which the present invention may be practiced. The various embodiments are not necessarily mutually exclusive, as aspects of one embodiment can be combined with aspects of another embodiment. These embodiments are described in sufficient detail to enable those skilled in the art to practice the invention. Other embodiments may be utilized and structural, logical, and electrical changes may be made without departing from the scope of the present invention.

It should be noted that references to "an", "one", or "various" embodiments in this disclosure are not necessarily to the same embodiment, and such references contemplate more than one embodiment.

Disclosed herein is a circuit module testing apparatus and method. The disclosed testing apparatus and method allow for high volume testing and increase the longevity of the printed circuit board, or load board, reducing production costs. A socket receptacle, or socket saver, is used on the load board to extend the usable life of the load board. A burn-in type socket is used, which lasts significantly longer, and allows the load board to be used in module handlers which increases the throughput and reduces the costs associated with testing the modules.

Circuit Module Testing Apparatus

Figure 1:
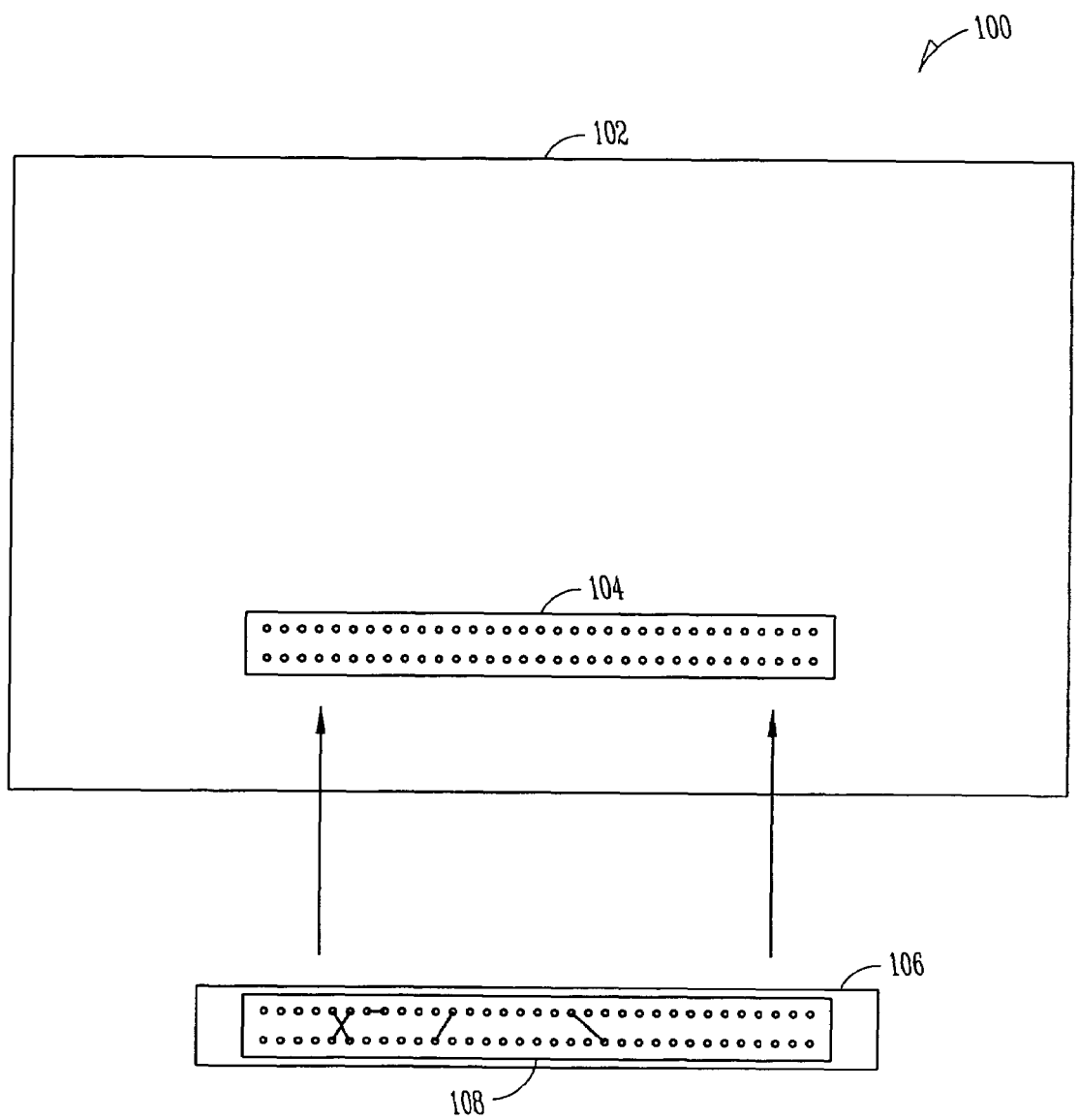
FIG. 1 illustrates a block diagram of a circuit module testing apparatus, according to various embodiments.

FIG. 1 illustrates a block diagram of a circuit module testing apparatus, according to various embodiments. According to an embodiment, the testing apparatus 100 includes a printed circuit board 102, or load board, and a socket receptacle 104, or socket saver, adapted to be connected to the printed circuit board 102. The apparatus 100 also includes a socket 106 having pins on a first side, the pins adapted to be removably inserted into the socket receptacle, and the socket adapted to receive a circuit module for testing. The apparatus 100 further includes a test circuit board 108 soldered to the first side of the socket, the test circuit board having selected pins shorted for testing the module and clipped to prevent engagement with the socket receptacle.

According to various embodiments, the circuit module to be tested includes a memory module. The memory module may include a fully-buffered dual inline memory module (FBDIMM), such as a second generation double data rate synchronous dynamic random access memory (DDR2 SDRAM), according to an embodiment. In one embodiment, the test circuit board has selected pins shorted for interconnect built-in self-testing (IBIST).

Various embodiments of a circuit module testing system include a printed circuit board, a socket receptacle adapted to be connected to the printed circuit board, and a socket having pins on a first side, the pins adapted to be removably inserted into the socket receptacle. The system embodiment further includes a test circuit board soldered to the first side of the socket, the test circuit board having selected pins shorted for testing memory modules and clipped to prevent engagement with the socket receptacle, and a memory module to be tested, the memory module adapted to plug into the socket.

According to various embodiments of the system, the socket includes a burn-in type socket. The printed circuit board is adapted to be used in module handlers, according to various embodiments. In one embodiment, the memory module includes a fully-buffered dual inline memory module (FBDIMM). High-speed channels of the FBDIMM are adapted to be shorted together for IBIST, in an embodiment.

Figure 2A:
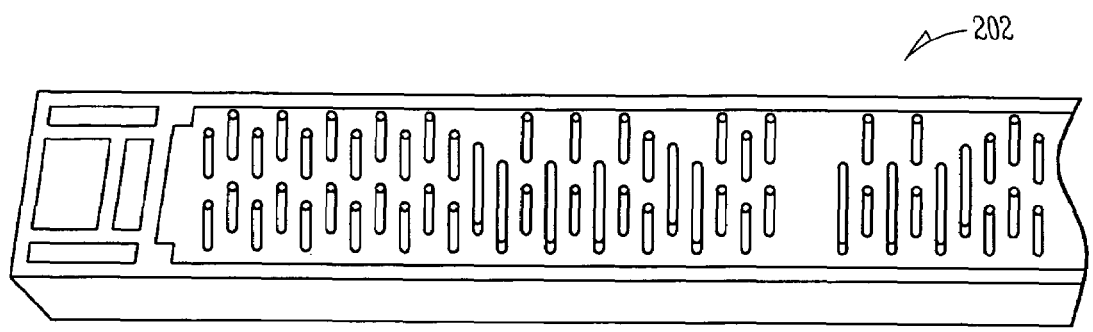
FIG. 2A illustrates a memory module testing apparatus, according to various embodiments.
Figure 2B:
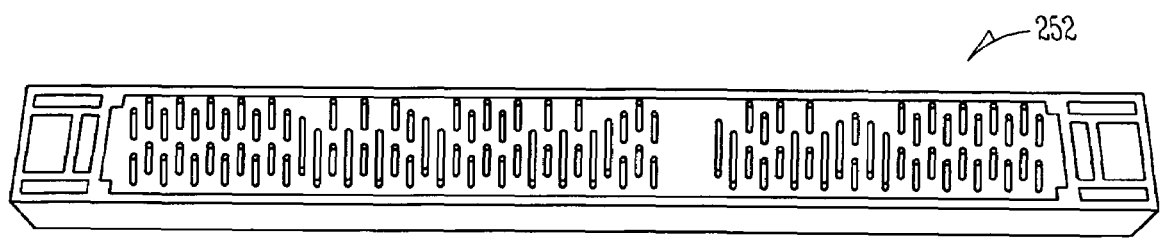
FIG. 2B illustrates a bottom view of a memory module testing apparatus, according to various embodiments.

FIG. 2A illustrates a memory module testing apparatus, according to various embodiments. The underside of the test circuit board 202 has selected pins shorted for testing the module and clipped to prevent engagement with the socket receptacle. FIG. 2B illustrates a bottom view of a memory module testing apparatus, according to various embodiments. The socket 252 is adapted to receive a circuit module for testing.

Circuit Module Testing Methods

Figure 3:
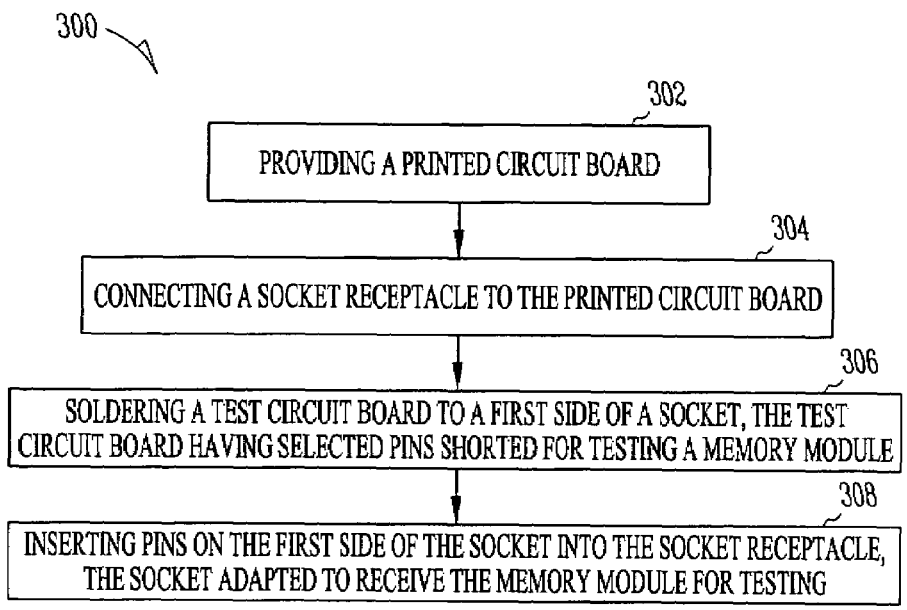
FIG. 3 illustrates a flow diagram of a method for making a circuit module testing apparatus, according to various embodiments.

FIG. 3 illustrates a flow diagram of a method for making a circuit module testing apparatus, according to various embodiments. One embodiment of the method 300 includes providing a printed circuit board, at 302, and connecting a socket receptacle to the printed circuit board, at 304. The method embodiment also includes soldering a test circuit board to a first side of a socket, the test circuit board having selected pins shorted for testing a memory module and clipped to prevent engagement with the socket receptacle, at 306, and inserting pins on the first side of the socket into the socket receptacle, the socket adapted to receive the memory module for testing, at 308.

According to various embodiments, testing a memory module includes testing a fully-buffered dual inline memory module (FBDIMM). Testing a memory module includes interconnect built-in self-testing (IBIST), according to an embodiment. Soldering a test circuit board to a first side of a socket includes soldering to a burn-in type socket, according to various embodiments. In an embodiment, connecting a socket receptacle to the printed circuit board includes soldering the receptacle to the board.

Figure 4:
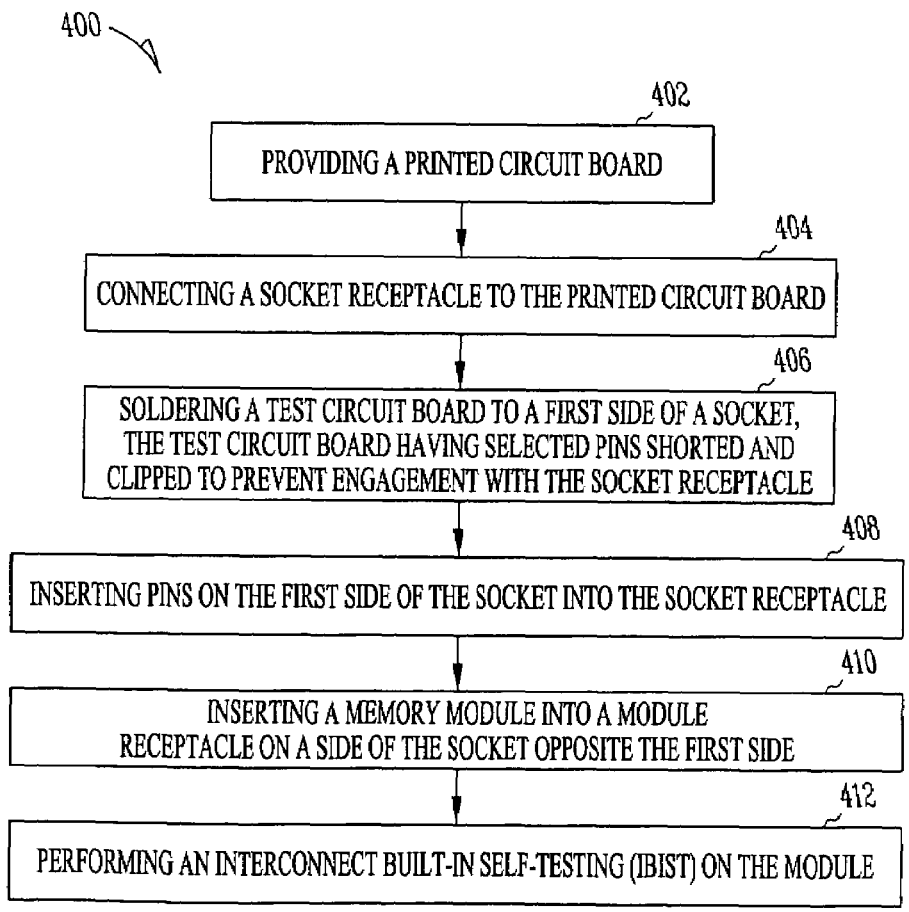
FIG. 4 illustrates a flow diagram of a method for testing a memory module, according to various embodiments.

FIG. 4 illustrates a flow diagram of a method for testing a memory module, according to various embodiments. Various embodiments of the method 400 include providing a printed circuit board, at 402, and connecting a socket receptacle to the printed circuit board, at 404. The method embodiment also includes soldering a test circuit board to a first side of a socket, the test circuit board having selected pins shorted and clipped to prevent engagement with the socket receptacle, at 406, and inserting pins on the first side of the socket into the socket receptacle, at 408. The method embodiment further includes inserting a memory module into a module receptacle on a side of the socket opposite the first side, at 410, and performing an interconnect built-in self-testing (IBIST) on the module, at 412.

According to various embodiments, inserting a memory module includes inserting a fully-buffered dual inline memory module (FBDIMM). Inserting a memory module includes inserting a second generation double data rate synchronous dynamic random access memory (DDR2 SDRAM) module, according to an embodiment. According to one embodiment, soldering a test circuit board includes soldering a test circuit board having high-speed channels of the FBDIMM shorted together. The method can be used to test a variety of circuit modules. According to various embodiments, the method can be used to test multiple modules. The tested memory module is removed, a second memory module is inserted into the module receptacle on the side of the socket opposite the first side, and testing is performed on the second module. These steps can be repeated for any number of modules, according to various embodiments. Robust sockets can be used for thousands of insertions, according to various embodiments.

Testing Applications

In the remaining figures, circuit modules will be described as they are used in a variety of applications. According to the teachings of the present disclosure, the modules described can be tested with various embodiments of the disclosed apparatus and methods.

Figure 5:
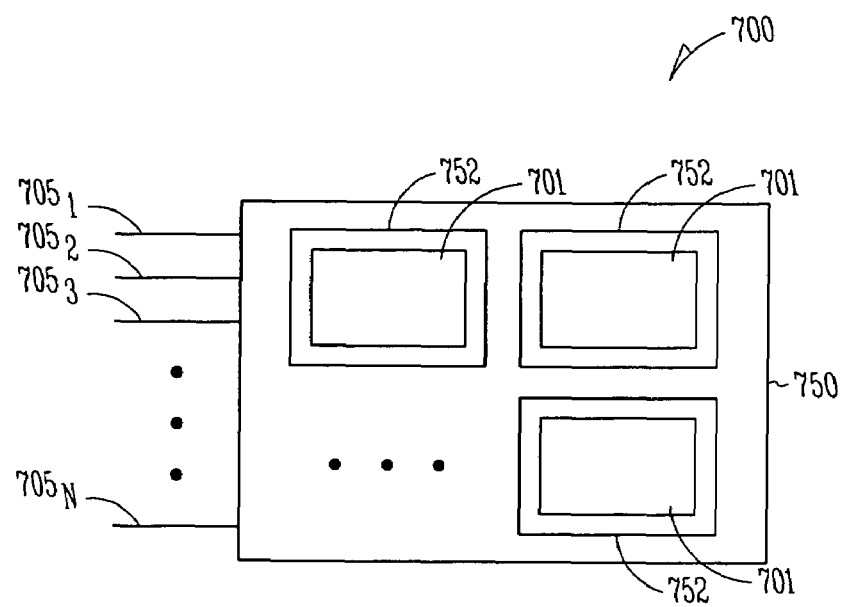
FIG. 5 illustrates a block diagram of a circuit module, according to various embodiments.

As shown in FIG. 5, two or more dies 701 may be combined, with or without protective casing, into a circuit module 700 to enhance or extend the functionality of an individual die 701. Circuit module 700 may be a combination of dies 701 representing a variety of functions, or a combination of dies 701 containing the same functionality. In one embodiment, circuit module 700 includes at least one socket, slot, recess or the like 752 into which the die 701 is received. Slot 752, in one embodiment, is a circuit board 750. Slot 752, in another embodiment, represents a mount including land patterns. In any embodiment, dies 701 may be received by slot 752 in a pick-and-place operation by suitable pick-and-place machines.

Some examples of a circuit module 700 include memory modules, device drivers, power modules, communication modems, processor modules and application-specific modules, and may include multilayer, multi-chip modules. Such modules will have a chip receiver in which a chip according to the present disclosure is inserted. Circuit module 700 may be a subcomponent of a variety of electronic systems, such as a clock, a television, a cell phone, a personal computer, an automobile, an industrial control system, an aircraft and others. Such modules will have a circuit module receiver in which a circuit module according to the present disclosure is inserted. Circuit module 700 will have a variety of leads $705_1$ through $705_N$ extending therefrom providing unilateral or bilateral communication and control in its particular application.

Figure 6:
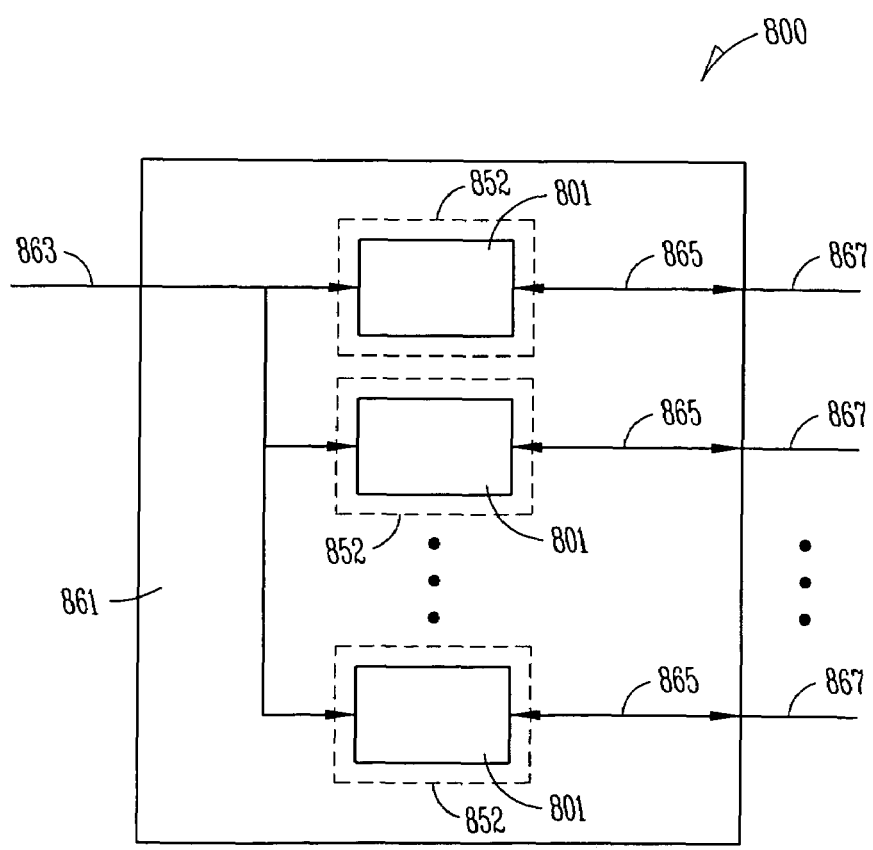
FIG. 6 illustrates a block diagram of a memory module, according to various embodiments.

FIG. 6 shows one embodiment of a circuit module as memory module 800. Memory module 800 contains multiple memory devices 801 contained on support 861. Representative memory devices include, but are not limited to DRAM, SRAM, SDRAM, EEPROM, flash memory, ROM, etc. In one embodiment, support 861 includes slots 852 for receiving memory devices 801. The number of memory devices generally depends upon the desired bus width and the desire for parity. Memory devices 801 include at least one die having a power supply in accordance with the present disclosure. The support 861 includes sockets, slots, recesses or the like 852, each adapted to receive a memory device 801 and provide electrical communication between a bus and memory device 801. Memory module 800 accepts a command signal from an external controller (not shown) on a command link 863 and provides for data input and data output on data links 865. The command link 863 and data links 865 are connected to leads 867 extending from the support 861. Leads 867 are shown for conceptual purposes and are not limited to the position shown.

Figure 7:
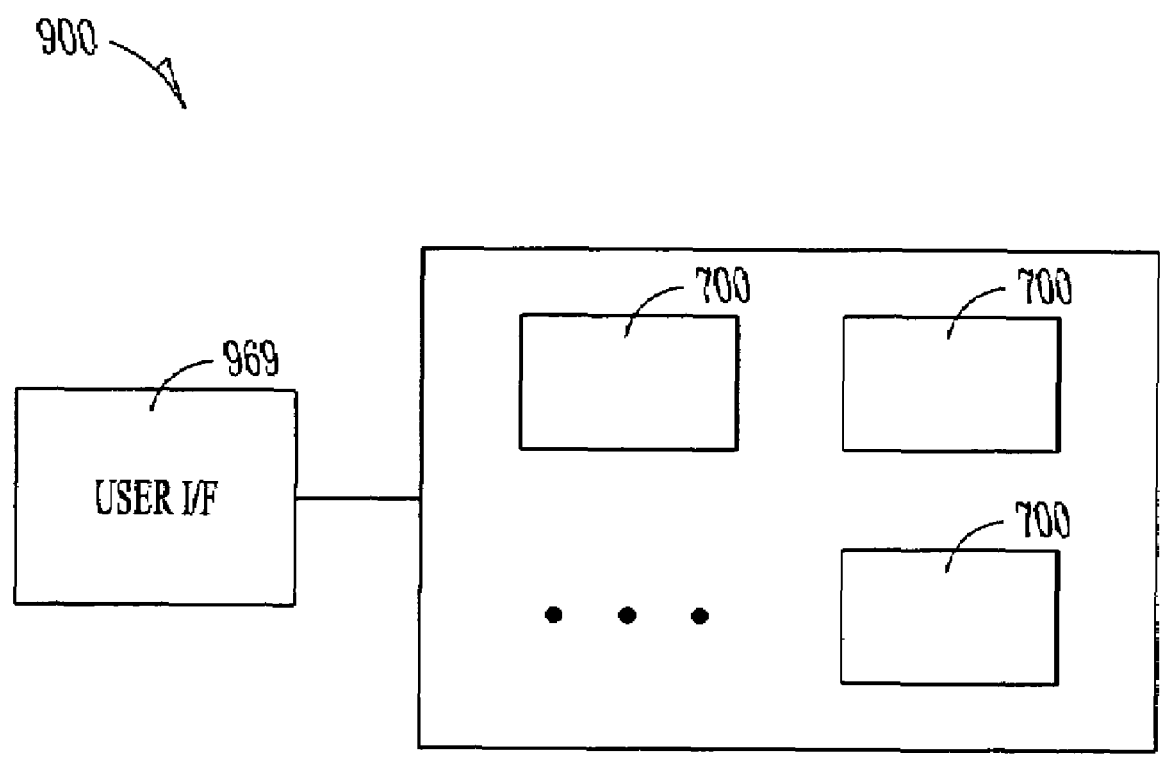
FIG. 7 illustrates a block diagram of an electronic system, according to various embodiments.

FIG. 7 shows one embodiment of an electronic system 900 containing one or more circuit modules 700. Electronic system 900 generally contains a user interface 969. User interface 969 provides a user of the electronic system 900 with some form of control or observation of the results of the electronic system 900. Some examples of user interface 969 include: the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 969 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 969, or of other information either preprogrammed into, or otherwise provide to, electronic system 900. In another embodiment, electronic system 900 includes memory modules 800. As will be apparent from the lists of examples previously given, electronic system 900 will often be associated with certain mechanical components (not shown) in addition to circuit modules 700 and user interface 969. It will be appreciated that one or more circuit modules 700 in electronic system 900 can be replaced by a single integrated circuit. Furthermore, electronic system 900 may be a subcomponent of a larger electronic system.

Figure 8:
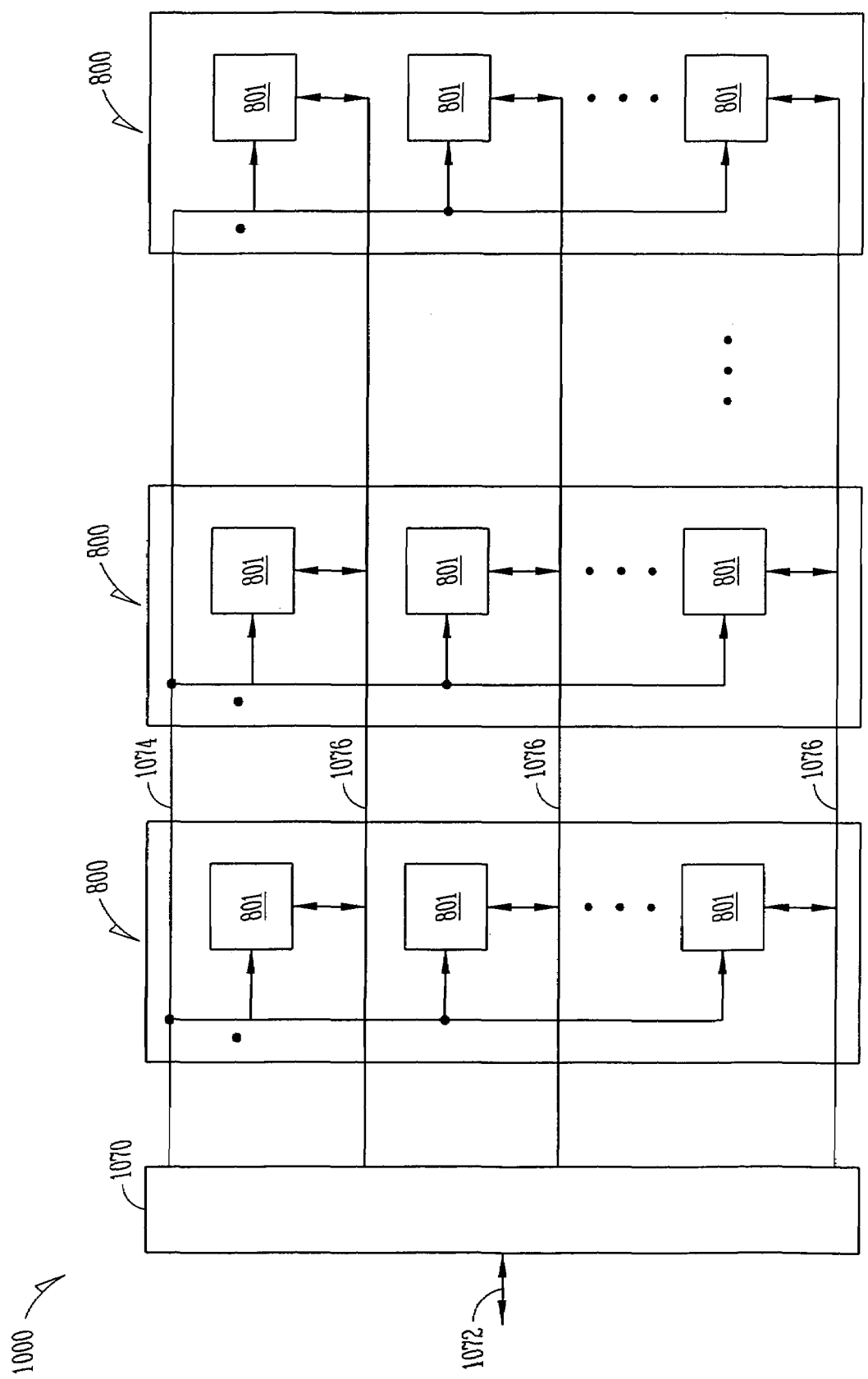
FIG. 8 illustrates a block diagram of a memory system, according to various embodiments.

FIG. 8 shows one embodiment of an electronic system as memory system 1000. Memory system 1000 contains one or more memory modules 800 and a memory controller 1070. At least one of the memory modules 800 can be tested in accordance with the present disclosure. Memory controller 1070 provides and controls a bidirectional interface between memory system 1000 and an external system bus 1072.

Memory system 1000 accepts a command signal from the external bus 1072 and relays it to the one or more memory modules 800 on a command link 1074. Memory system 1000 provides for data input and data output between the one or more memory modules 800 and external system bus 1072 on data links 1076.

Figure 9:
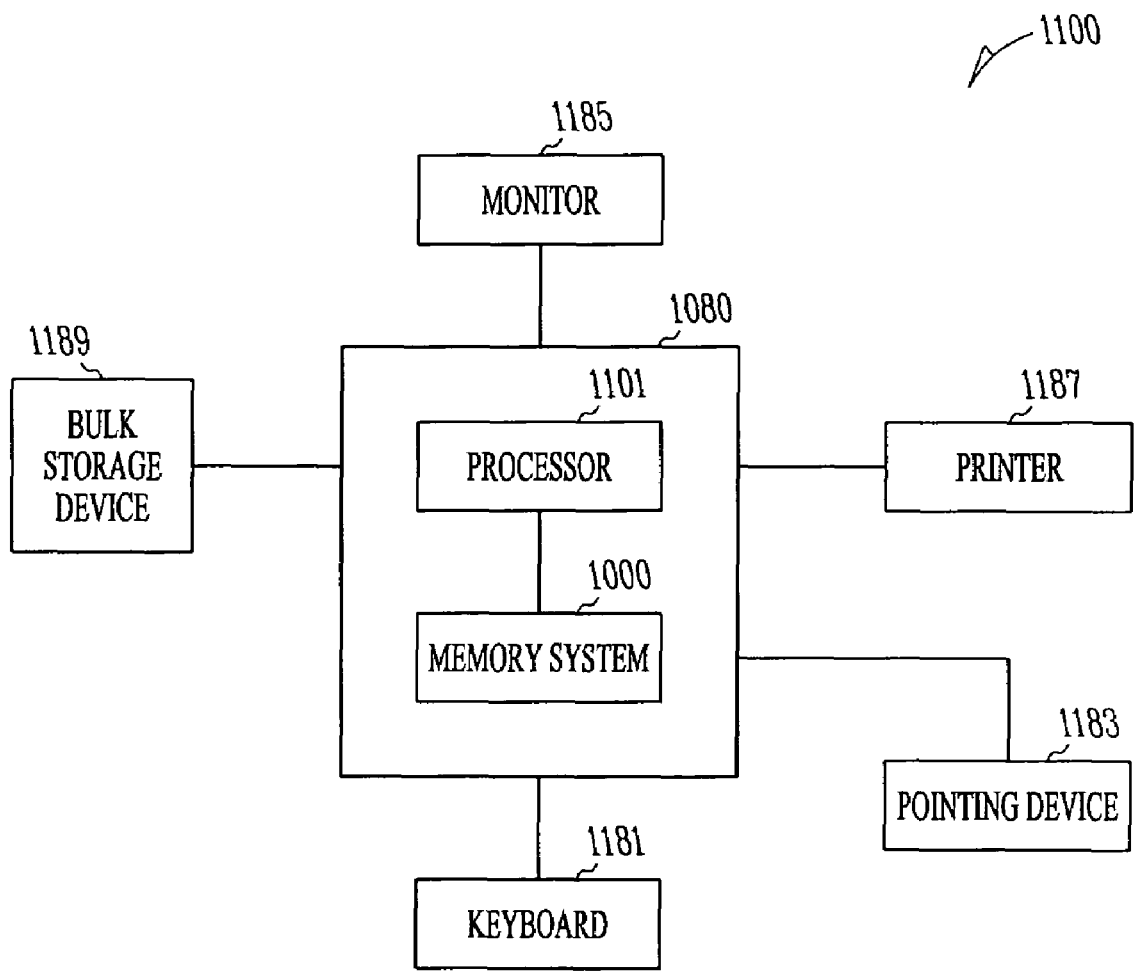
FIG. 9 illustrates a block diagram of a computer system, according to various embodiments.

FIG. 9 shows a further embodiment of an electronic system as a computer system 1100. Computer system 1100 contains a processor 1101 and a memory system 1000 housed in a computer unit 1080. Computer system 1100 is but one example of an electronic system containing another electronic system, i.e., memory system 1000, as a subcomponent. Computer system 1100 optionally contains interface components. Depicted in FIG. 9 are a keyboard 1181, a monitor 1185, a pointing device 1183 such as a mouse, trackball or joystick, a monitor 1185, a printer 1187 and a bulk storage device 1189. It will be appreciated that other components are often associated with computer system 1100 such as modems, device drivers, additional storage devices, etc. It will be appreciated that the processor 1101 and memory system 1000 of computer system 1100 can be incorporated on a single integrated circuit. Such single package processing units reduce the communication time between the processor and the memory circuit.

One of ordinary skill in the art will understand that, the modules and other circuitry shown and described herein can be implemented using software, hardware, and combinations of software and hardware. As such, the illustrated modules and circuitry are intended to encompass software implementations, hardware implementations, and software and hardware implementations.

The methods illustrated in this disclosure are not intended to be exclusive of other methods within the scope of the present subject matter. Those of ordinary skill in the art will understand, upon reading and comprehending this disclosure, other methods within the scope of the present subject matter. The above-identified embodiments, and portions of the illustrated embodiments, are not necessarily mutually exclusive. These embodiments, or portions thereof, can be combined. In various embodiments, the methods provided above are implemented as a computer data signal embodied in a carrier wave or propagated signal, that represents a sequence of instructions which, when executed by a processor cause the processor to perform the respective method. In various embodiments, methods provided above are implemented as a set of instructions contained on a computer-accessible medium capable of directing a processor to perform the respective method. In various embodiments, the medium is a magnetic medium, an electronic medium, or an optical medium.

Although specific embodiments have been illustrated and described herein, it will be appreciated by those of ordinary skill in the art that any arrangement which is calculated to achieve the same purpose may be substituted for the specific embodiment shown. This application is intended to cover adaptations or variations of the present subject matter. It is to be understood that the above description is intended to be illustrative, and not restrictive. Combinations of the above embodiments as well as combinations of portions of the above embodiments in other embodiments will be apparent to those of skill in the art upon reviewing the above description. The scope of the present subject matter should be determined with reference to the appended claims, along with the full scope of equivalents to which such claims are entitled.

What is claimed is:

1. An apparatus, comprising:
   a printed circuit board;
   a socket receptacle adapted to be connected to the printed circuit board;
   a socket having pins on a first side, the pins adapted to be removably inserted into the socket receptacle, the socket adapted to receive a circuit module for testing; and
   a test circuit board soldered to the first side of the socket, the test circuit board adapted to short selected pins of the socket for testing the module, wherein the selected pins are clipped to prevent engagement with the socket receptacle.

2. The apparatus of claim 1, wherein the circuit module includes a memory module.

3. The apparatus of claim 2, wherein the memory module includes a fully-buffered dual inline memory module (FB-DIMM).

4. The apparatus of claim 3, wherein the memory module includes a second generation double data rate synchronous dynamic random access memory (DDR2 SDRAM).

5. The apparatus of claim 1, wherein the test circuit board is adapted to short selected pins of the socket for interconnect built-in self-testing (IBIST).

6. A system, comprising:
   a printed circuit board;
   a socket receptacle adapted to be connected to the printed circuit board;
   a socket having pins on a first side, the pins adapted to be removably inserted into the socket receptacle;
   a test circuit board soldered to the first side of the socket, the test circuit board adapted to short selected pins of the socket for testing the module, wherein the selected pins are clipped to prevent engagement with the socket receptacle; and
   a memory module to be tested, the memory module adapted to plug into the socket.

7. The system of claim 6, wherein the socket includes a burn-in type socket.

8. The system of claim 6, wherein the printed circuit board is adapted to be used in module handlers.

9. The system of claim 6, wherein the memory module includes a fully-buffered dual inline memory module (FB-DIMM).

10. The system of claim 9, wherein high-speed channels of the FBDIMM are adapted to be shorted together for IBIST.

11. A method, comprising:
    providing a printed circuit board;
    connecting a socket receptacle to the printed circuit board;
    soldering a test circuit board to a first side of a socket, the test circuit board adapted to short selected pins of the socket for testing the module, wherein the selected pins are clipped to prevent engagement with the socket receptacle; and
    inserting pins on the first side of the socket into the socket receptacle, the socket adapted to receive the memory module for testing.

12. The method of claim 11, wherein testing a memory module includes testing a fully-buffered dual inline memory module (FBDIMM).

13. The method of claim 11, wherein testing a memory module includes interconnect built-in self-testing (IBIST).

14. The method of claim 11, wherein soldering a test circuit board to a first side of a socket includes soldering to a burn-in type socket.

15. The method of claim 11, wherein connecting a socket receptacle to the printed circuit board includes soldering the receptacle to the board.

16. A method, comprising:
    providing a printed circuit board;

connecting a socket receptacle to the printed circuit board;

soldering a test circuit board to a first side of a socket, the test circuit board adapted to short selected pins of the socket for testing the module, wherein the selected pins are clipped to prevent engagement with the socket receptacle;

inserting pins on the first side of the socket into the socket receptacle;

inserting a memory module into a module receptacle on a side of the socket opposite the first side; and performing an interconnect built-in self-testing (IBIST) on the module.

17. The method of claim 16, wherein inserting a memory module includes inserting a fully-buffered dual inline memory module (FBDIMM).

18. The method of claim 16, wherein inserting a memory module includes inserting a second generation double data rate synchronous dynamic random access memory (DDR2 SDRAM) module.

19. The method of claim 16, wherein soldering a test circuit board includes soldering a test circuit board having high-speed channels of the FBDIMM shorted together.

20. The method of claim 16, further comprising:

removing the memory module;

inserting a second memory module into the module receptacle on the side of the socket opposite the first side; and performing interconnect built-in self-testing (IBIST) on the second module.

* * * * *